(12) United States Patent
Liao et al.

(10) Patent No.: US 7,063,939 B2
(45) Date of Patent: Jun. 20, 2006

(54) METHOD FOR HIGH ASPECT RATIO PATTERN TRANSFER

(75) Inventors: Weng-Chung Liao, Tainan (TW); Lien-Chung Hsu, Tainan (TW); Po-I Lee, Tainan (TW); Min-Hsiung Hon, Tainan (TW); Chau-Nan Hong, Tainan (TW)

(73) Assignee: National Cheng Kung University, Tainan (TW)

( * ) Notice: Subject to any disclaimer, the term of this patent is extended or adjusted under 35 U.S.C. 154(b) by 69 days.

(21) Appl. No.: 10/781,870

(22) Filed: Feb. 20, 2004

(65) Prior Publication Data

US 2005/0026090 A1    Feb. 3, 2005

(30) Foreign Application Priority Data

Jul. 31, 2003   (TW)   ............................... 92120930 A

(51) Int. Cl.
*G03F 7/30*   (2006.01)
*G03F 7/023*  (2006.01)

(52) U.S. Cl. ................... 430/325; 430/192; 430/281.1; 430/326; 430/327; 430/330

(58) Field of Classification Search ............... 430/325, 430/326, 327, 330, 189, 281.1, 192
See application file for complete search history.

(56) References Cited

U.S. PATENT DOCUMENTS

| 5,772,905 | A  |   | 6/1998  | Chou              | 216/44    |
|-----------|----|---|---------|-------------------|-----------|
| 2003/0205657 | A1 | * | 11/2003 | Voisin            | 249/187.1 |
| 2003/0205658 | A1 | * | 11/2003 | Voisin            | 249/187.1 |
| 2004/0008334 | A1 | * | 1/2004  | Sreenivasan et al.| 355/72    |
| 2004/0141163 | A1 | * | 7/2004  | Bailey et al.     | 355/18    |
| 2005/0123674 | A1 | * | 6/2005  | Stasiak et al.    | 427/62    |

OTHER PUBLICATIONS

T.C. Bailey et al.; "Step and Flash Imprint Lithography: An Efficient Nanocale Printing Technology"; *J. Photopolymer Science Technology*; 6 pages; 2002.

* cited by examiner

*Primary Examiner*—John S. Chu
(74) *Attorney, Agent, or Firm*—Troxell Law Office, PLLC

(57) ABSTRACT

The present invention relates a method for high aspect ratio pattern transfer, by using combination of imprint and Step and Flash techniques to transfer high aspect ratio pattern. The present invention simultaneously saves the developing time and the amount of developer used during the photoresist pattern transfer process. The present invention is able to avoid separation and dissolution between pattern and substrate that is attacked by developer, and is able to yield high aspect ratio patterns.

6 Claims, 25 Drawing Sheets

Step and Flash

UV light distribution

METHOD FOR HIGH ASPECT RATIO PATTERN TRANSFER

REFERENCE CITED

1. U.S. Pat. No. 5,772,905 Nanoimprint lithography
2. T. C. Bailey, et. al., Step and flash imprint lithography An Effcient Nanocale Printing Technology. J. Photopolymer Sci. Tech. 15(3) 481(2002).

FIELD OF THE INVENTION

The present invention relates to the imprint and mask used to transfer photoresist patterns. More specifically, the present invention relates to a method that creates patterns with high aspect ratio of the thin film carried on the surface of a substrate.

BACKGROUND OF THE INVENTION

The nano technique is one of the most popular research fields today. It brings a new industrial revolution and a great strike to the economy and social development. Subsidy from official institute for Nano-technique research also makes a multiple growth of industry in many countries. As stated by Professor Kari Rissanen of Jyvaskyla University, using Nano techniques would make the scale of systems or facilities apparently minimized and the other characteristics can be remained still. Nano electrons are able to be speeded up and make the computer more efficient. New techniques which can be used to store information inside the molecule may increase the storage capacity of electronic facilities. Therefore, it is obviously that Nano-chemistry, Nano-biology and Nano-physics would open a new stage for those domains such as medicine science, energy environment and optics.

Between 1997 and 1999, TEKES and Academy of Finland have supported 16 projects of Nano-technology research. Among them, the project of CHANIL of VTT had been run for 2 years, and the main purpose of the project was to develop the Nano Imprint Lithography (NIL) technology, which is able to create a sub-100 nm pattern with low cost.

NIL is a compression molding technique invented by Stephen Chou at University of Minnesota in 1996. A mold is heated and pressed into a thin polymeric (ex. PMMA—Polymethyl Methacrylate) film that have been coated on the wanted substrate. After the cooling and the separation between mold and polymeric layer, the stereo patterns will be completely transferred. After the treatment of dry etching such as plasma etching or RIE (Reactive dry etching), the residual layer will be removed and the wanted patterns will be achieved.

Recently, Princeton University proposed a method that produces Metal Oxide Semiconductor Field-Effect Transistor (MOSFET) element by using the way of Nano imprint lithography technique on a 4-inch wafer.

On the other hand, Prof. Wilson (University of Texas, Austin) uses UV-curing polymer as transfer layer in developing the NIL technique, called the "Step and flash" technique which makes the pattern transfer at low temperature possible. The overall process is shown as FIG. 12. The etching barrier shown as in FIG. 12 is a coated layer which is formulated by cross-linkable monomers, said the photoresist.

As the conventional imprint technique, Step and Flash technique needs to use plasma or other dry etching process to remove the residual layer till the substrate exposed to atmosphere. By this way, both the wanted pattern and the residual layer will be etched and it will make the resist patterns thinner. While taking the cost into consideration, conventional optical lithography cost less. But we all know that resist which is supposed to be removed will be washed by developer from the surface to the substrate (as shown in FIG. 13). So the period of developing must be controlled precisely or the developer would damage the reserved patterns. As shown in FIG. 14 & 15, in the process of a conventional optical lithography, we need the parallel light to produce a straight side wall of the photoresist to avoid the scattering and reflection effect that would make additional unwanted photosensitive reaction.

Furthermore, while transferring the high aspect ratio patterns, we usually need thick resist layer, as shown in FIG. 16 and subsequent limitation in resolution will be caused by the longer distance that light has the more deviation.

Nevertheless, both dry etching machine for nanoimprint lithography and high performance exposure equipments for optical lithography cost lot. Therefore, we need a new method to make this work faster, cheaper and more efficient and combining the imprint and optical lithography will be the solution.

SUMMARY OF THE INVENTION

The present invention relates to a transfer method for a high aspect ratio pattern and it can save the developing time and the amount of developer used during the photo-resist pattern transferring process. Besides, this invention can avoid the separation and deformation of resist layer owing to over exposed to developer and etchant.

For the above purpose, methods for high aspect ratio pattern transfer of positive photoresist application comprise the steps of:

(1) obtaining a transparent moldboard with stereo patterns and depositing a mask material layer on the substrate.

(2) after finishing solidifying said masking layer, grinding the protruding part of the figure of said moldboard to make the protruding part pervious to light;

(3) obtaining a substrate applied with positive photoresist and then urging the mold at a molding pressure into the film creating a thickness contrast pattern in the film, wherein the molding pressure is sufficiently high to transfer the features to the film and the molding pressure causes a local deformation in the mold which is less than the mold pattern lateral dimension with said substrate that has the photoresist layer with protruding-and-recessing figure for further processing Step and Flash;

(4) after finishing said Step and Flash process, removing said moldboard from said substrate; and (5) With developer, washing exposed portions of the thin film covered with positive photoresist on the substrate to show the unexposed portion whereby produces high aspect ratio pattern.

On the other hand, said method for high aspect ratio pattern transfer of negative photoresist application may comprise the steps of:

(1) obtaining a moldboard which is both pervious to light and has a protruding-and-recessing figure to form masking layer by way of sputtering deposition of masking material on said moldboard;

(2) after finishing solidifying said masking layer, grinding the recessing and wall part of the figure of said moldboard to make the recessing and part pervious to light;

(3) obtaining a substrate applied with negative photoresist and then urging the mold at a molding pressure into the film creating a thickness contrast pattern in the film, wherein the molding pressure is sufficiently high to transfer the features to the film and the molding pressure causes a local deformation in the mold which is less than the mold pattern lateral dimension with said substrate that has the photoresist layer with a protruding-and-recessing figure for further processing Step and Flash;

(4) after finishing said Step and Flash process, removing said moldboard from said substrate; and (5) With developer, washing unexposed portions of the thin film on the substrate which is covered with negative photoresist to show the exposed portion whereby produces high aspect ratio pattern.

By the above steps, the followings are achieved: to save developing time and the amount of developer used during the photo-resist pattern transfer process; to be able to avoid problems of separation and dissolution between pattern and substrate owing to over expose the photoresist in the developer while transferring the pattern; and so to transfer high aspect ratio patterns.

BRIEF DESCRIPTION OF THE DRAWINGS

The present invention will be better understood from the following detailed description of preferred embodiments of the invention, taken in conjunction with the accompanying drawings, in which

FIG. 3-1 and FIG. 3-2 and FIG. 3-3 are views showing step (3) according to the present invention;

FIG. 9-1 and FIG. 9-2 and FIG. 9-3 are views showing step 3 of the preferred embodiment according to the present invention;

FIG. 17-1 and FIG. 17-2 are views of scanning electron microscope showing moldboard according to the present invention; and FIG. 17-3, FIG. 17-4 and FIG. 17-5 are views of scanning electron microscope showing high aspect ratio pattern according to the present invention.

DESCRIPTION OF THE PREFERRED EMBODIMENTS

The following descriptions of the preferred embodiments are provided to understand the features and the structures of the present invention.

Figure 1:
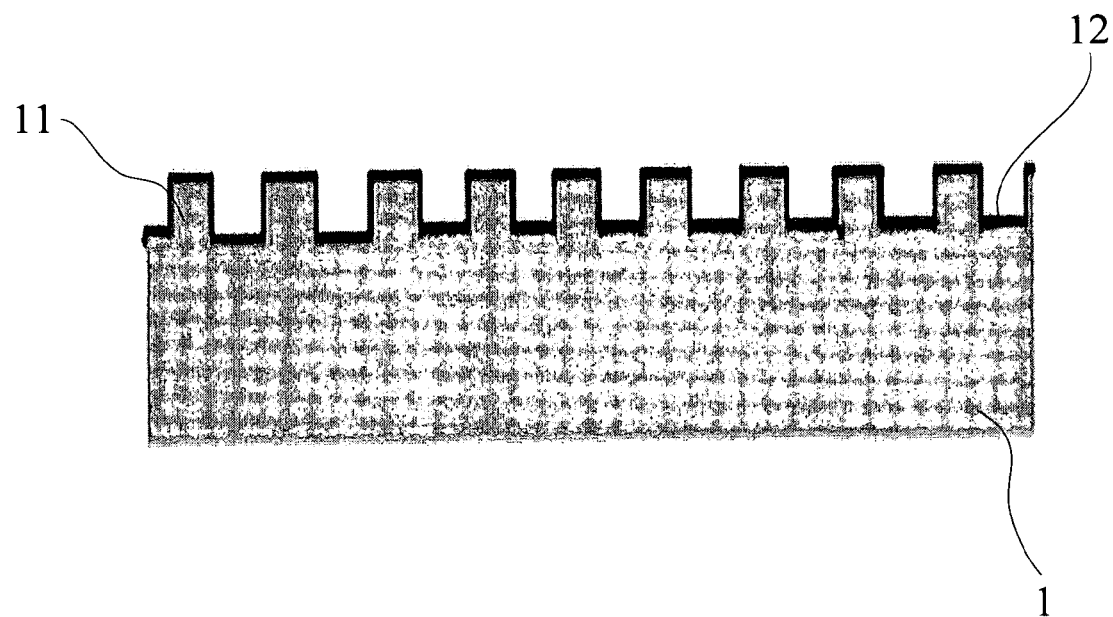
FIG. 1 is a view showing step (1) according to the present invention.
Figure 2:
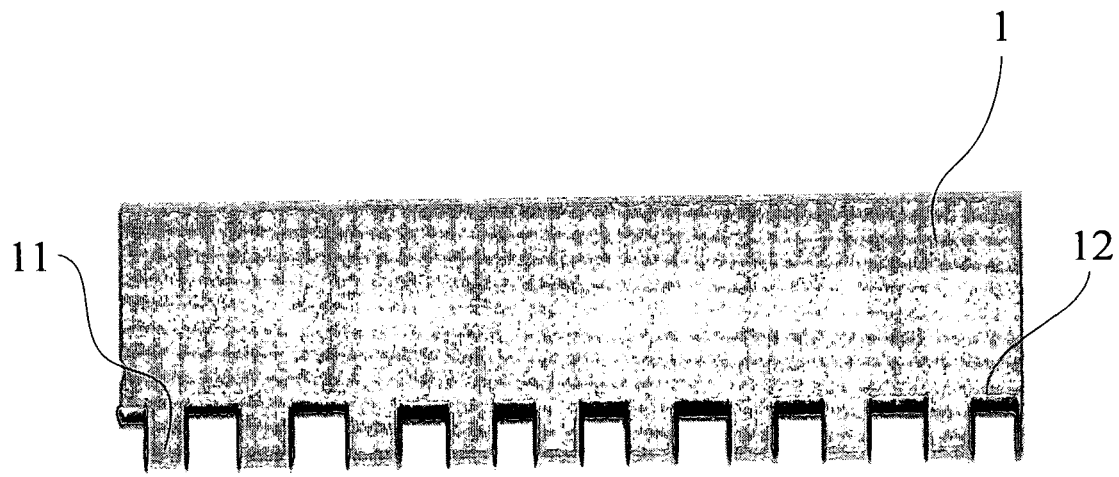
FIG. 2 is a view showing step (2) according to the present invention.
Figures 1, 3:
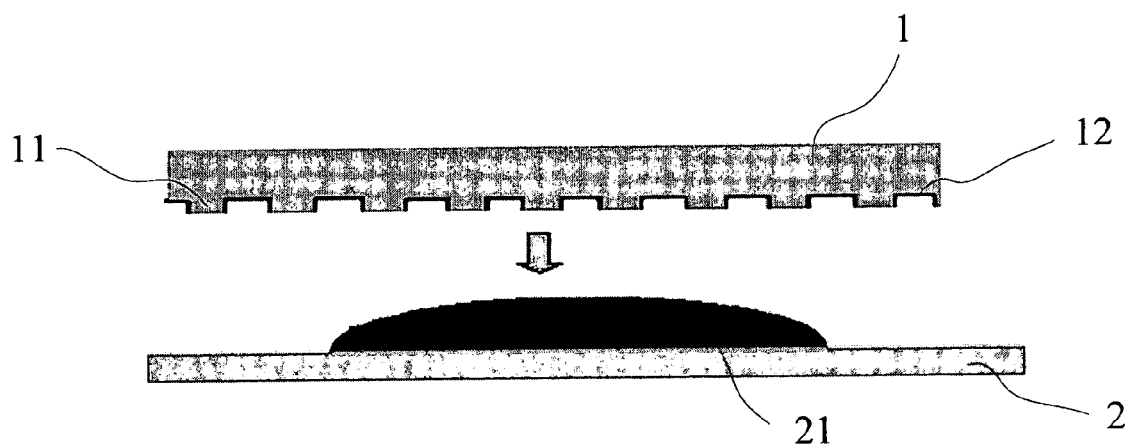
Figures 2, 3:
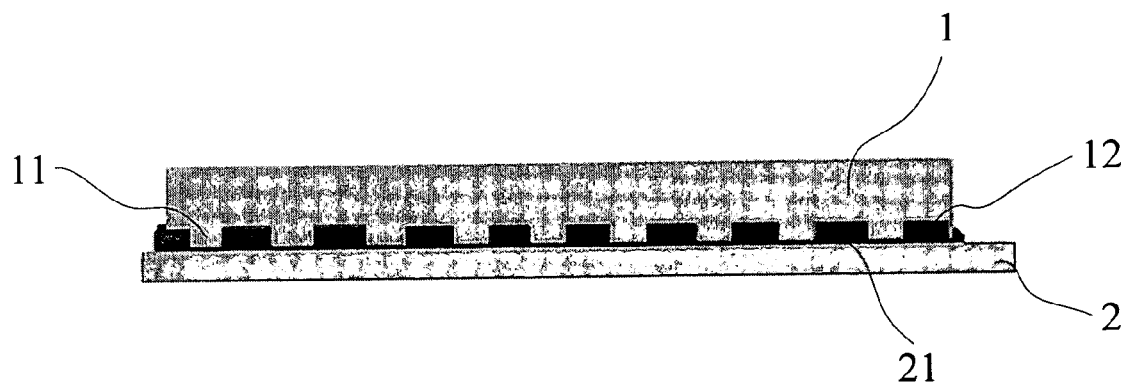
Figure 3:
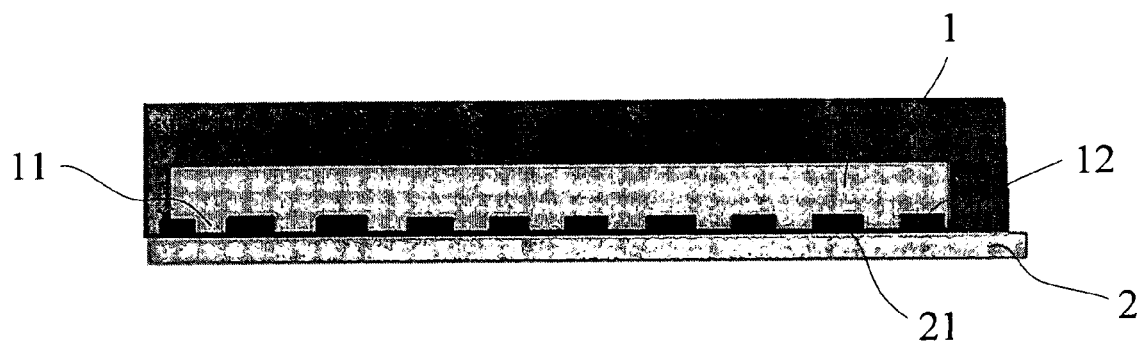
Figure 4:
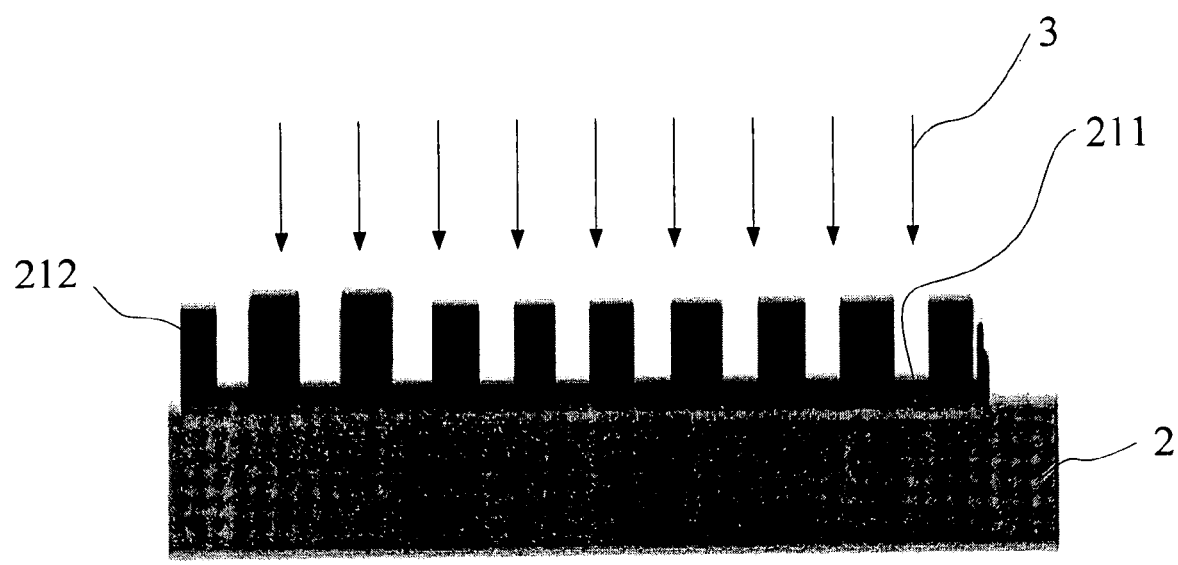
FIG. 4 is a view showing step (4) according to the present invention.
Figure 5:
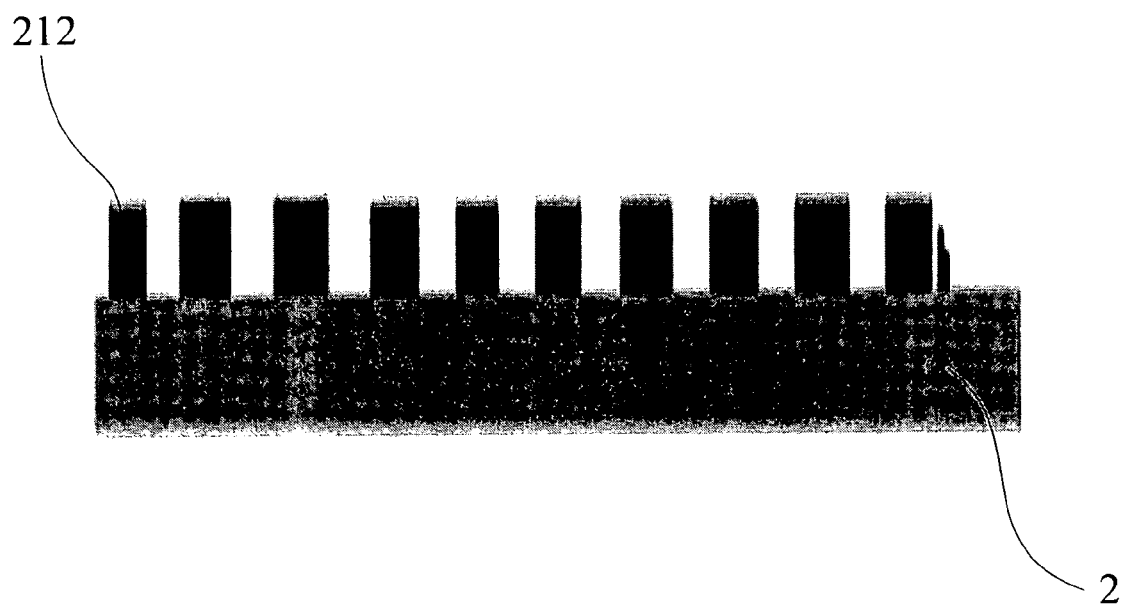
FIG. 5 is a view showing step (5) according to the present invention.
Figure 6:
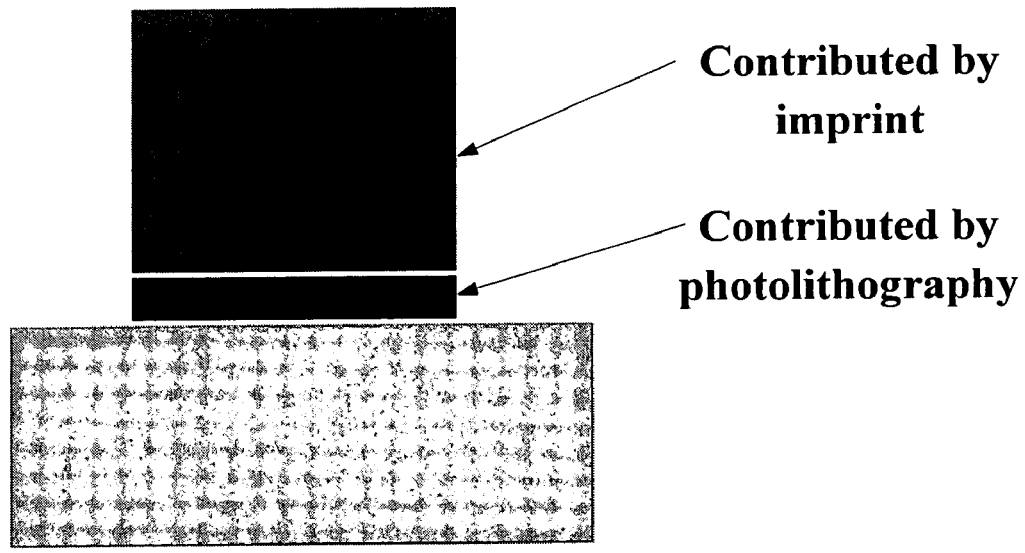
FIG. 6 is a view showing the imprint and mask microlithography portion according to the present invention.
Figure 11:
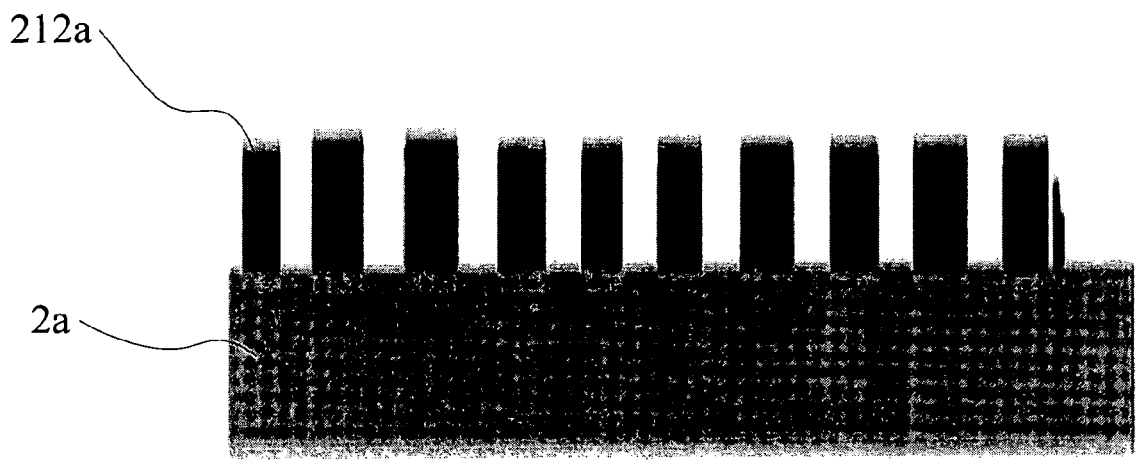
FIG. 11 is a view showing step 5 of the preferred embodiment according to the present invention.
Figure 12:
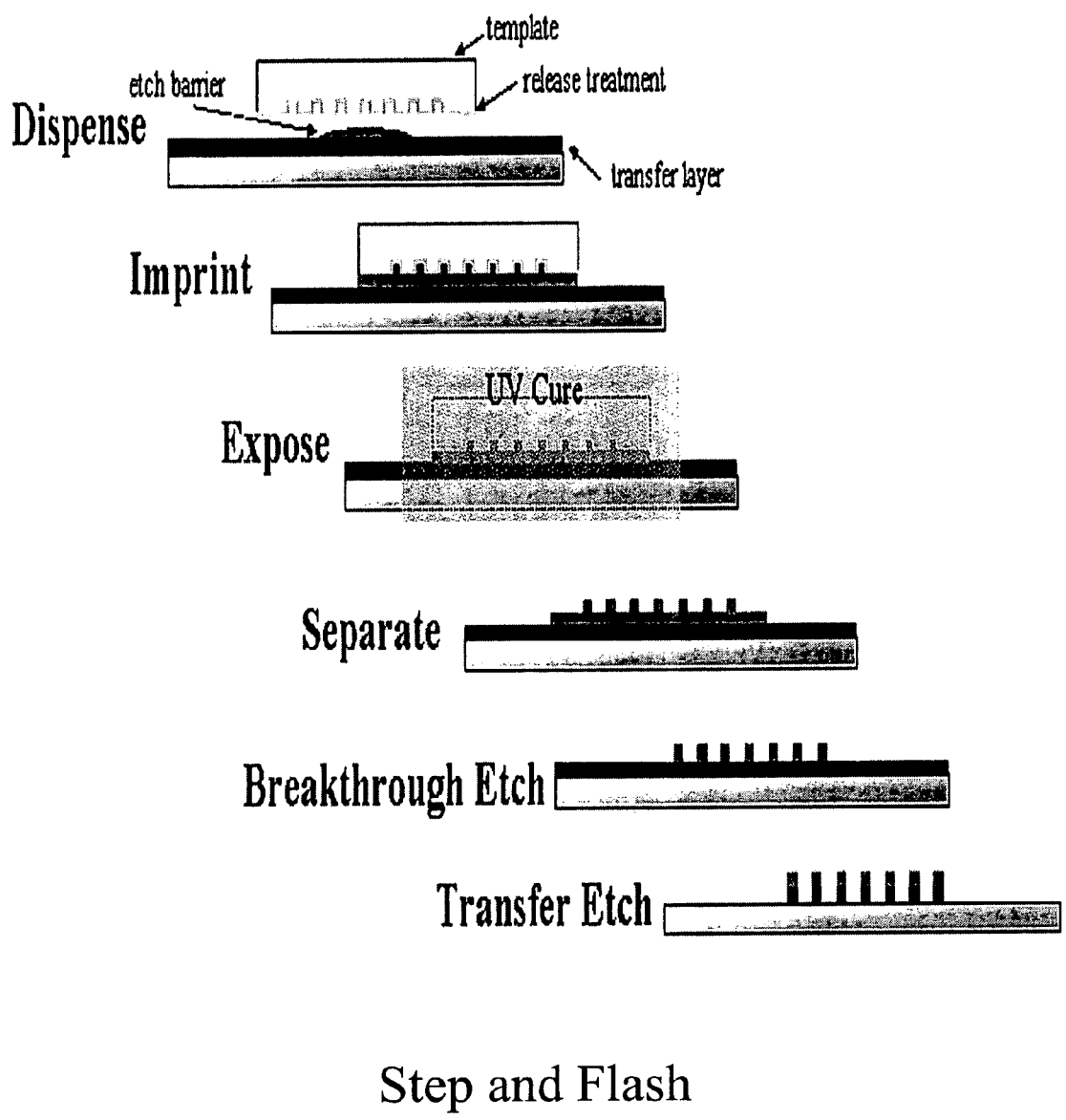
FIG. 12 is a view showing the imprint process of a conventional technique.
Figure 13:
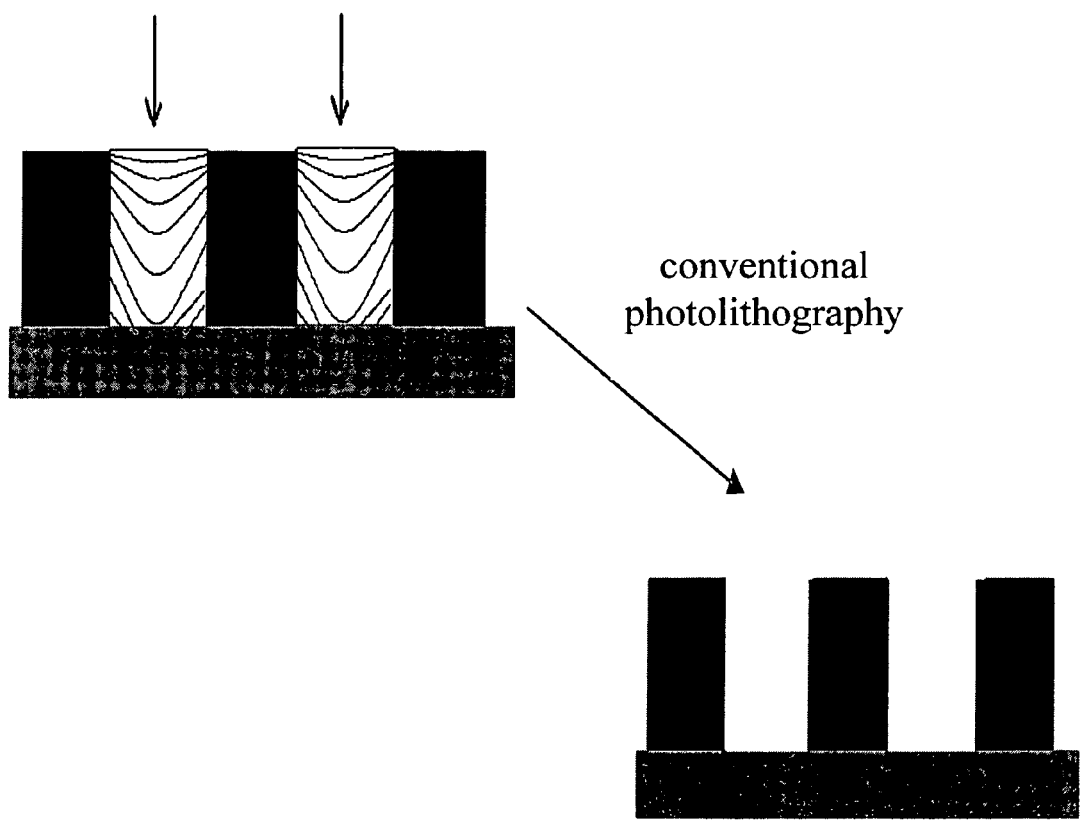
FIG. 13 is a view showing the mask microlithography of a conventional technique.
Figure 14:
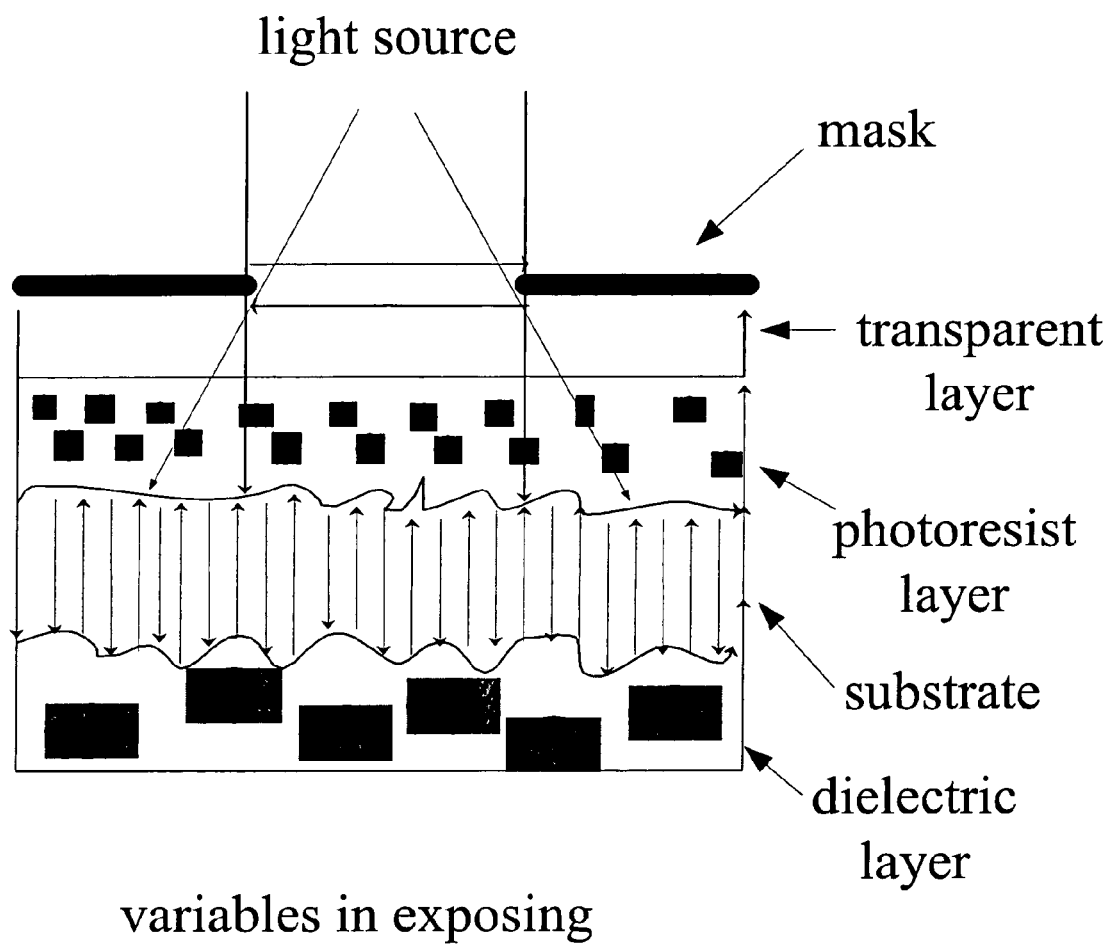
FIG. 14 & FIG. 15 are views showing the expose reaction mechanism of a conventional technique.
Figure 15:
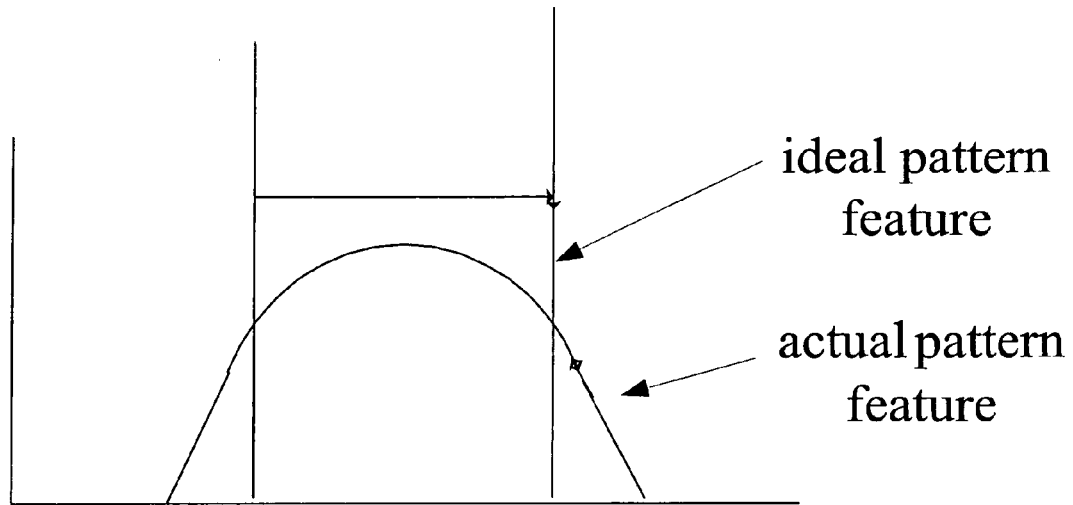
Figure 16:
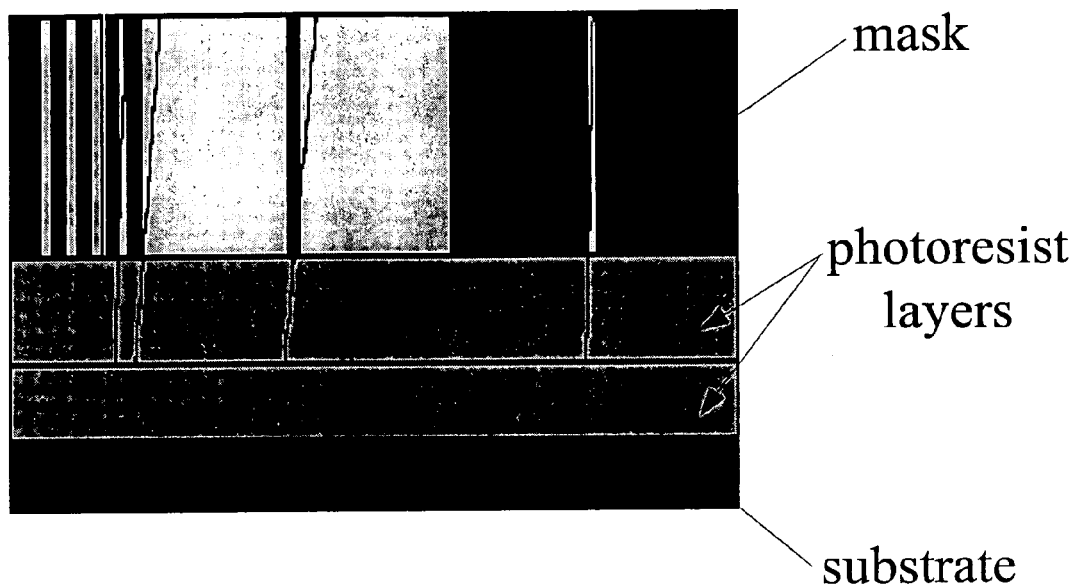
FIG. 16 is a view showing the resolution limit of a conventional technique.

Please refer to FIG. 1 to FIG. 6. FIG. 1 is a view showing step (1) according to the present invention. FIG. 2 is a view showing step (2) according to the present invention. FIG. 3-1 and FIG. 3-2 and FIG. 3-3 are views showing step (3) according to the present invention. FIG. 4 is a view showing step (4) according to the present invention. FIG. 5 is a view showing step (5) according to the present invention. FIG. 6 is a view showing the imprint and mask microlithography portion according to the present invention. As these figures showing, the present invention relates to a method for high aspect ratio pattern transfer, more specifically the invention is related to a method: that saves developing time and the amount of developer used during the photoresist pattern transfer process; that is able to avoid separation and dissolution between pattern and substrate attacked by overtime developer; and that yields high aspect ratio patterns. Therefore, the method comprises:

(1) obtaining a moldboard 1 which is both pervious to light and has a protruding-and-recessing FIG. 11 to form masking layer by way of sputtering deposition of masking material 12 on said moldboard (2) After finishing solidifying said masking layer, grinding the protruding part of the FIG. 11 of said moldboard 1 to make the protruding part pervious to light (3) obtaining a substrate 2 applied with positive photoresist 21 and then urging the mold at a molding pressure into the film creating a thickness contrast pattern in the film, wherein the molding pressure is sufficiently high to transfer the features to the film and the molding pressure causes a local deformation in the mold which is less than the mold pattern lateral dimension with said substrate 2 that has a protruding-and-recessing FIG. 11 for further processing Step and Flash (4) After finishing said Step and Flash process, removing said moldboard 1 from said substrate 2; and (5) With developer, washing exposed portions 211 of the thin film 21 covered with positive photoresist on the substrate 2 to show the unexposed portion 212 whereby produces high aspect ratio pattern as shown in FIG. 6.

During the process of the present invention, only the exposed portion of the thin film 21 of mask part that has positive photoresist can be washed by developer 3 to transfer high aspect ratio pattern on the substrate 2 which is similar to the figure of the moldboard 1. And, only a low amount of developer 3 and a short developing time is needed. In the range of demanding resolution which is affordable, thick photoresist contributes a high mask part to more easily transfer a high aspect ratio pattern, wherein the positive photoresist 21 comprises Novolac/DQ system that allows exposing portions to become acid after flashing, and then so exposed portion can be washed by alkaline developer.

Reaction mechanism of said positive photoresist 21 comprises:

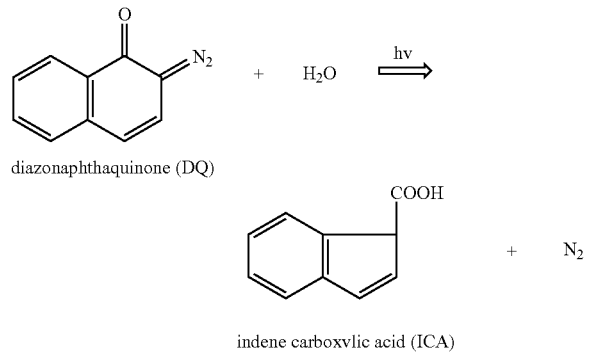

diazonaphthaquinone (DQ)

indene carboxvlic acid (ICA)

Figure 7:
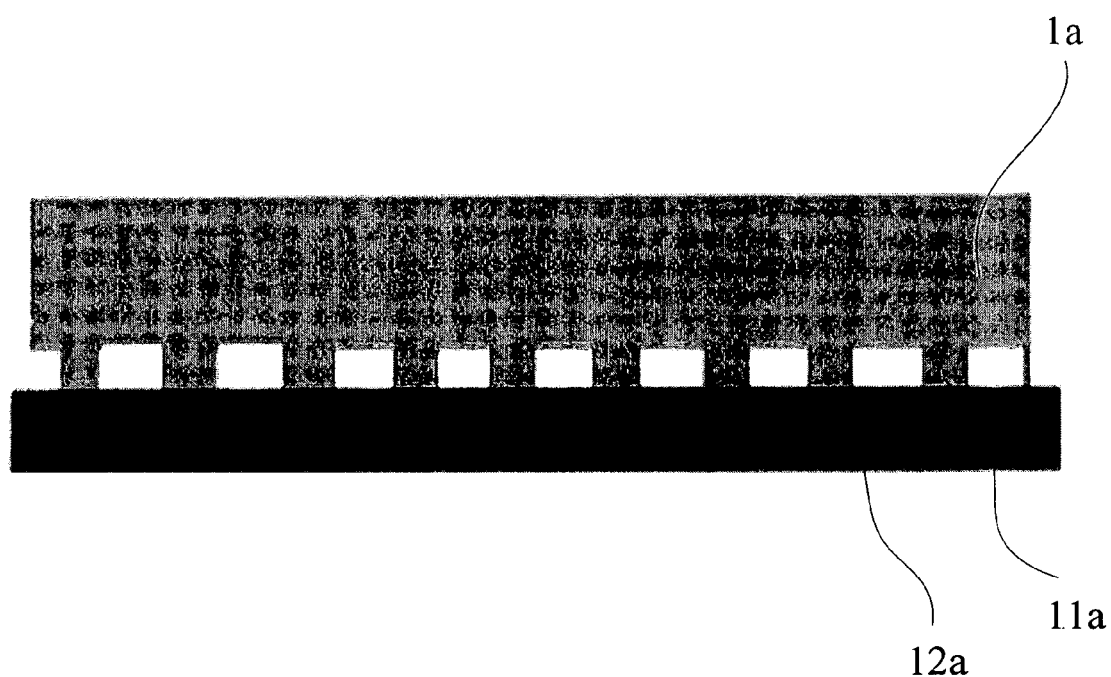
FIG. 7 is a view showing step 1 of the preferred embodiment according to the present invention.
Figure 8:
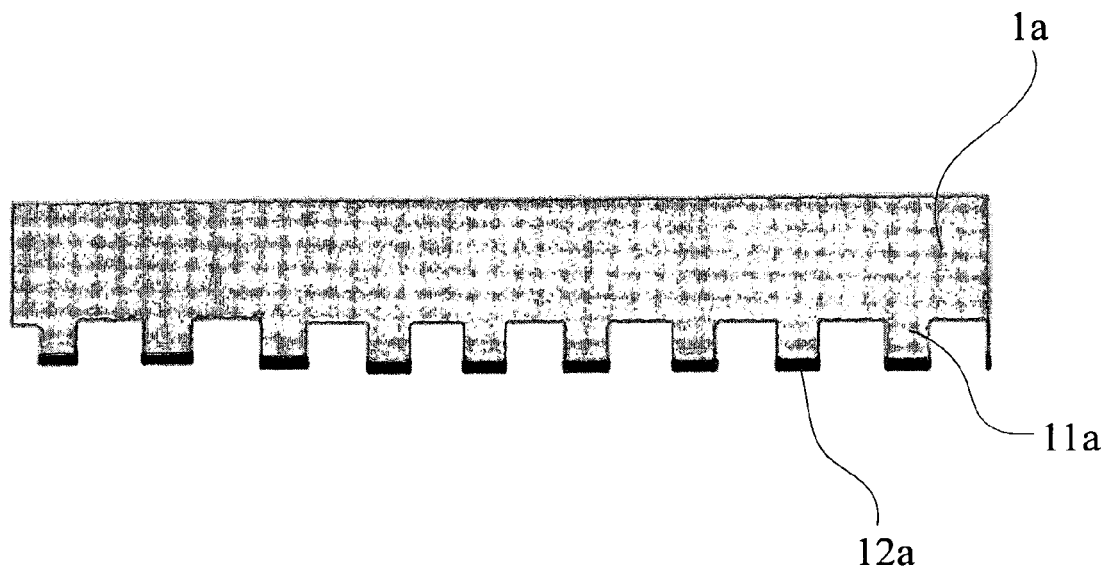
FIG. 8 is a view showing step 2 of the preferred embodiment according to the present invention.
Figures 1, 9:
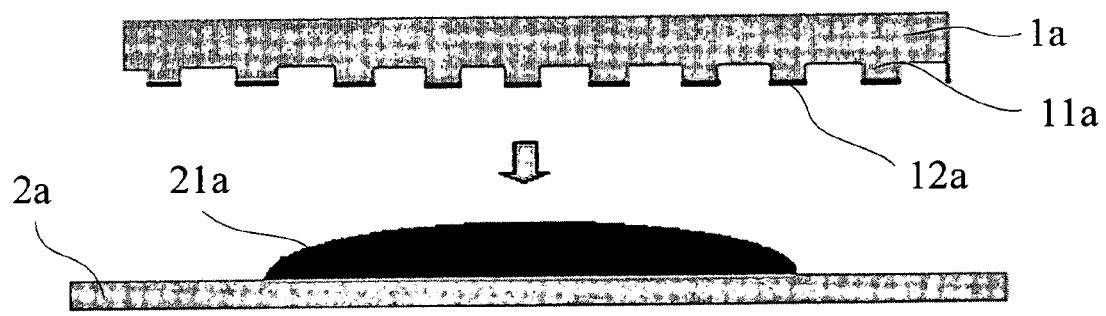
Figures 2, 9:
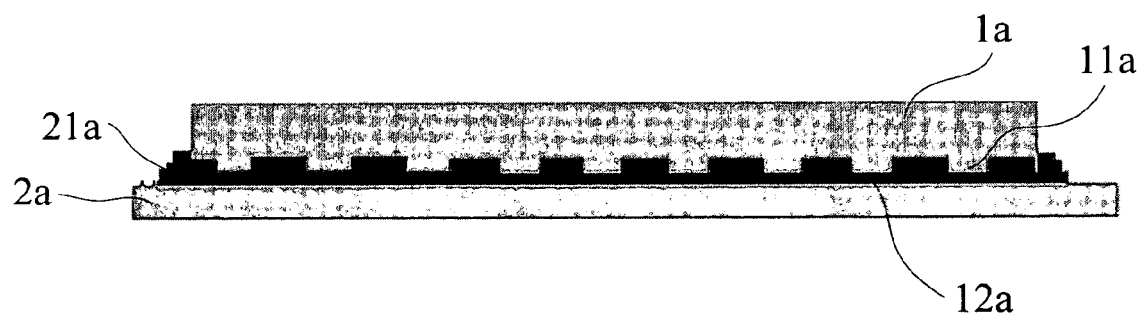
Figures 3, 9:
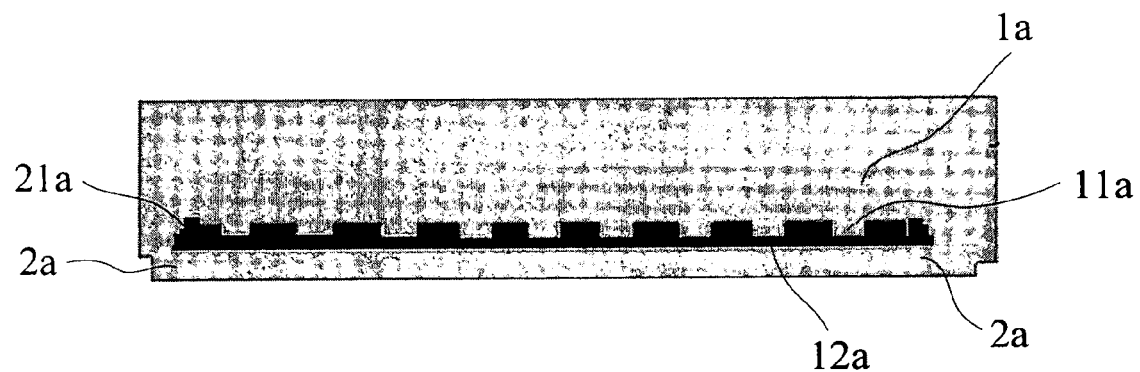
Figure 10:
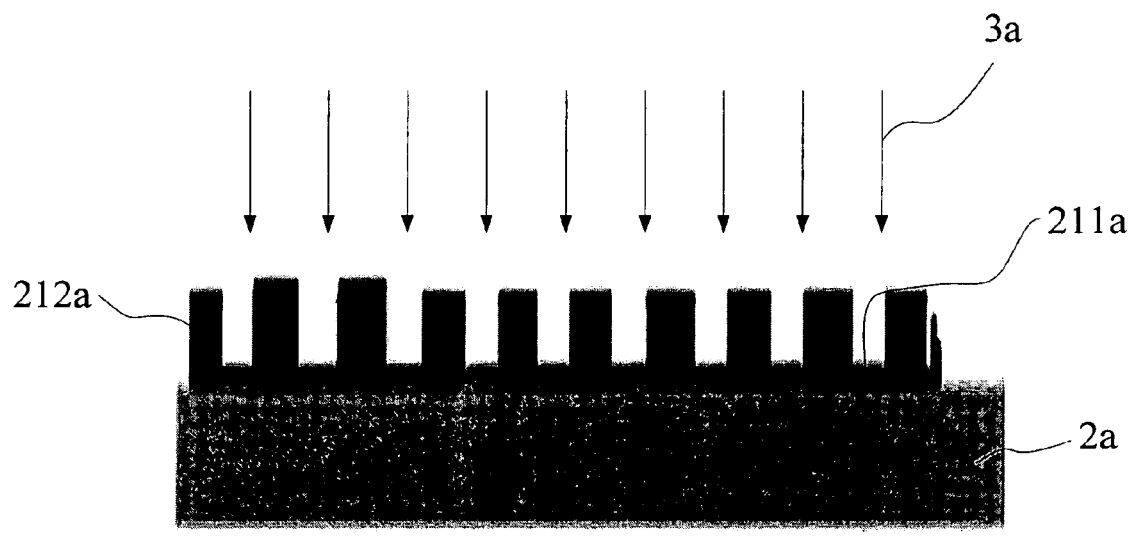
FIG. 10 is a view showing step 4 of the preferred embodiment according to the present invention.

Please refer to FIG. 7 to FIG. 11. FIG. 7 is a view showing step 1 of the preferred embodiment according to the present invention. FIG. 8 is a view showing step 2 of the preferred embodiment according to the present invention. FIG. 9-1 and FIG. 9-2 and FIG. 9-3 are views showing step 3 of the preferred embodiment according to the present invention. FIG. 10 is a view showing step 4 of the preferred embodiment according to the present invention. FIG. 11 is a view showing step 5 of the preferred embodiment according to the present invention. As shown in the above figures, the present invention relates to a method for high aspect ratio pattern transfer, more specifically present invention can save the developing time and the amount of developer used during the pattern transfer. It can also avoid the pattern to be attacked by developer and can yield high aspect ratio patterns. The method comprises:

(1) obtaining a moldboard 1a which is both pervious to light and has a protruding-and-recessing FIG. 11a to form masking layer by way of sputtering deposition of masking material 12a on said moldboard 1a;

(2) After finishing solidifying said masking layer 12a, obtaining a substrate 2a and applying negative photoresist 21a on said substrate;

(3) Covering said moldboard with said substrate 1a that has a protruding-and-recessing FIG. 11a for processing Step and Flash from the said moldboard side;

(4) after finishing said Step and Flash process, removing said moldboard 1a from said substrate; and (5) with developer 3a, washing unexposed portions 211a of the thin film covered with negative photoresist on the substrate to show the exposed portion 212a whereby produces high aspect ratio pattern.

During the process of the present invention, only the unexposed portion 212a of the thin film of mask part need to be washed by developer 3a to transfer high aspect ratio pattern which is the same as that of the moldboard. That is similar to positive photoresist 21 mentioned above, only low amount of developer 3a and short developing time is needed. In the range of demanding resolution which is affordable, thick photoresist contributes a high mask part to more easily transfer a high aspect ratio pattern, wherein exposed portion of said negative photoresist 21a forms polymerization or is cross-linked after flashing and that unexposed portion can be washed by alkaline developer to form high aspect ratio pattern on the substrate.

Reaction mechanism of said negative photoresist comprises:

Photoinitiator + UV light = 2 radicals

Figures 1, 17:
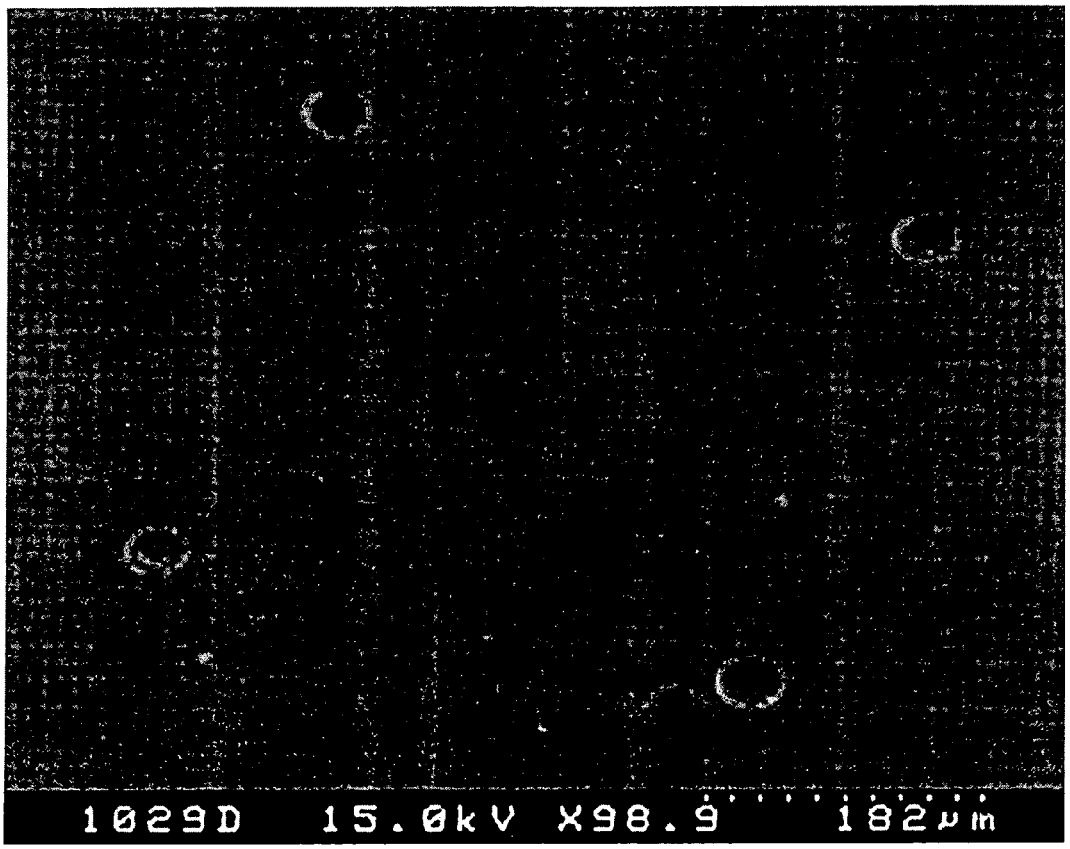
Figures 2, 17:
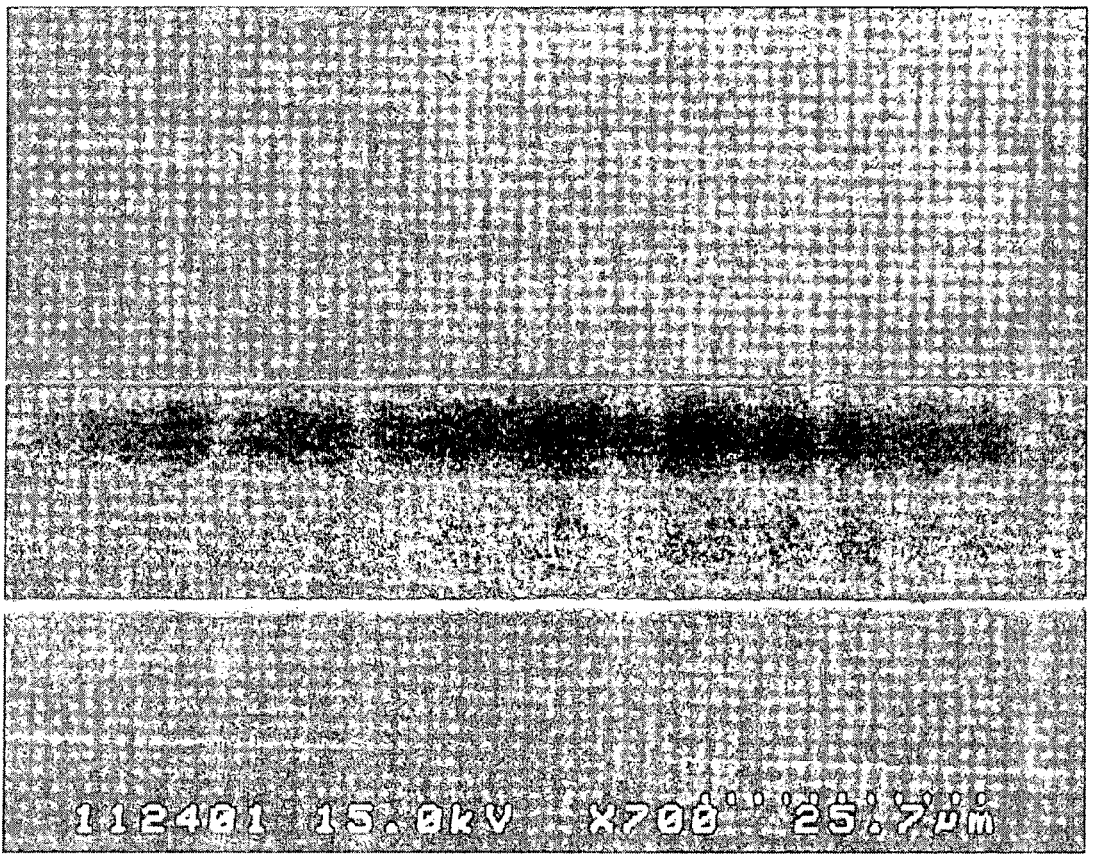
Figures 3, 17:
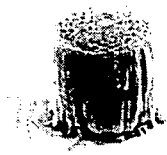
Figures 4, 17:
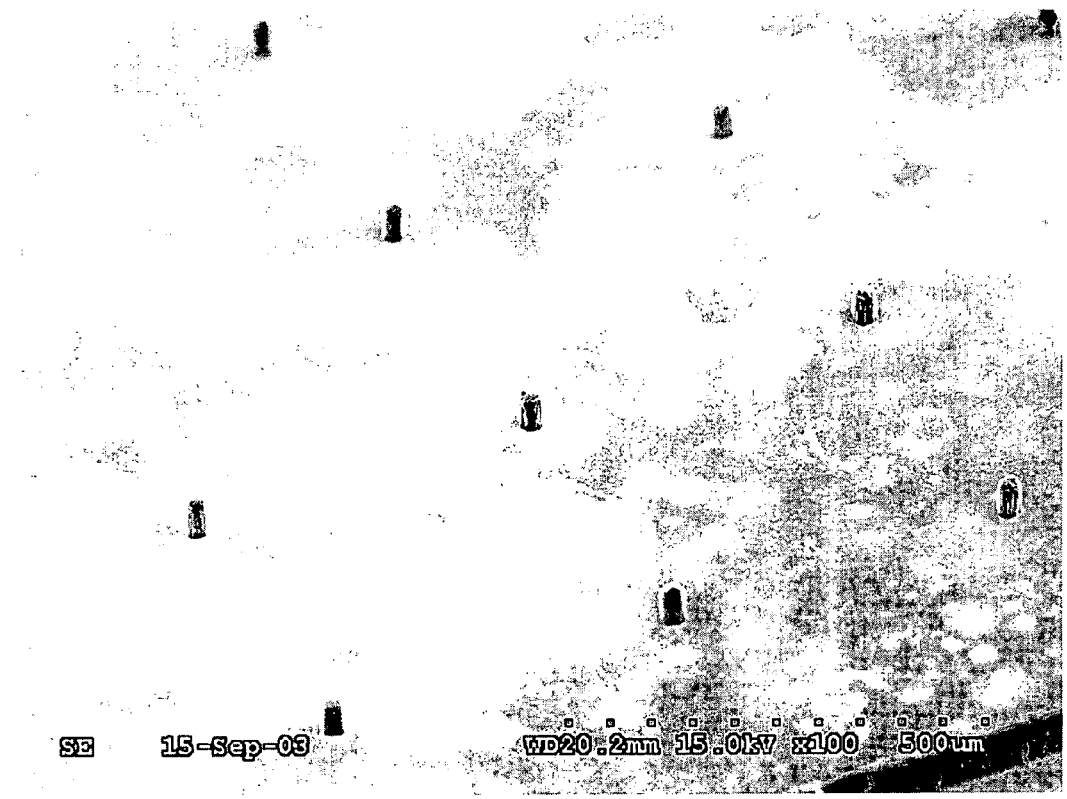
Figures 5, 17:
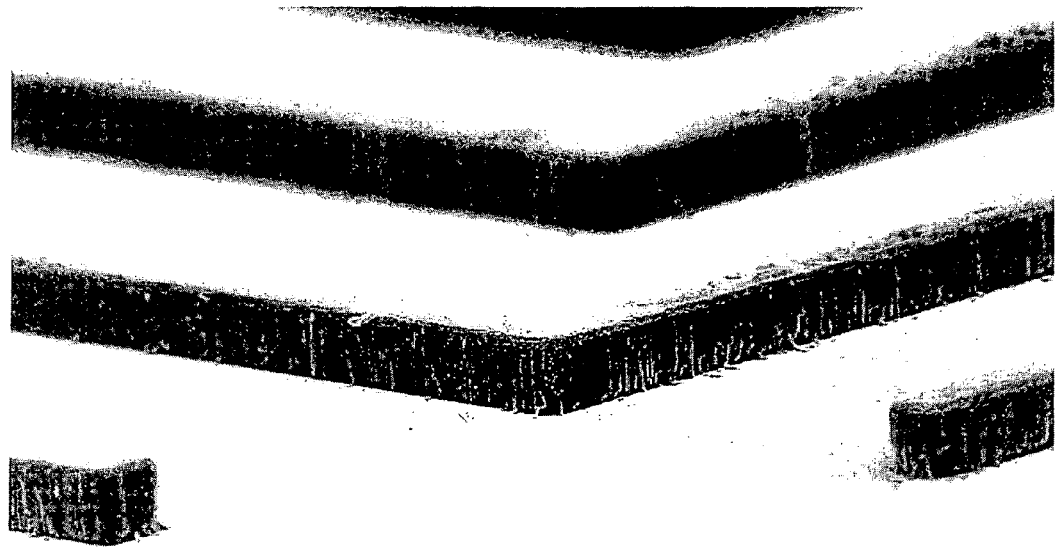

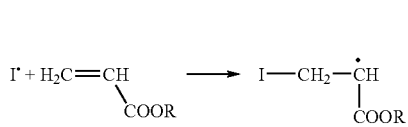

radical will transfer to the acrylic molecular it combines to and induce an active chain reaction unit From the above two type of microlithography fabrication, photoresist acts as a factor to protect the area which is needed in etching process. Therefore, structure of photoresist is very important. When etching fabrication, if the photoresist has the undercut (with the feature of wider the upside and narrower the downside) shape, the photoresist can be easily separated from the substrate and the circuit of device would be broken. If the photoresist has foot shape (with the feature of wider the downside and narrower the upside), the pitch of line would be quite possible not identical. Please refer to FIG. 17-1 to FIG. 17-5; the present invention is to provide vertical side walls and the both high aspect ratio and high resolution photoresist patterns.

The present invention may be embodied in other specific forms without departing from the spirit of the essential attributes thereof; therefore, the illustrated embodiment should be considered in all respects as illustrative and not restrictive, and as reference being made to the appended claims rather than to the foregoing description to indicate the scope of the invention.

What is claimed is:

1. A method for high aspect ratio pattern transfer of positive photoresist application comprising the steps of:
   (1) obtaining a moldboard being pervious to light and having a protruding-and-recessing figure and forming a masking layer by way of sputtering deposition of a masking material on said moldboard;
   (2) after solidifying said masking layer, grinding the masking layer on the protruding part of said figure of said moldboard making said protruding part pervious to light;
   (3) obtaining a substrate applied with positive photoresist and then urging the mold at a molding pressure into the film creating a thickness contrast pattern in the film, wherein the molding pressure is sufficiently high to transfer the features to the film and the molding pressure causes a local deformation in the mold which is less than the mold pattern lateral dimension with said substrate that has said protruding-and-recessing figure for further processing Step and Flash;
   (4) after finishing said Step and Flash process, removing said moldboard from said substrate; and
   (5) with a developer, washing exposed portions of the thin film covered with said positive photoresist on said substrate to show the unexposed portion whereby produces high aspect ratio pattern.

2. The method according to claim 1, wherein said positive photoresist comprises Novolac/DQ system that allows said exposed portion to become acid after flashing, and then said exposed portion is washed by an alkaline developer.

3. The method according to claim 2, wherein the reaction mechanism of said positive photoresist comprises:

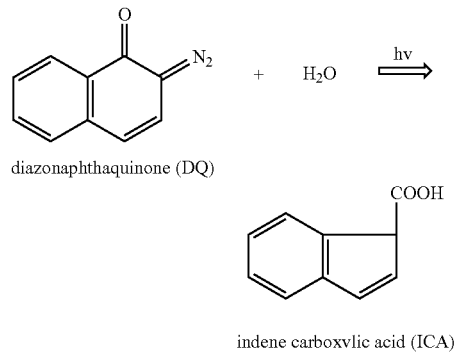

diazonaphthaquinone (DQ)

indene carboxvlic acid (ICA)

4. A method for high aspect ratio pattern transfer of negative photoresist application comprising the steps of:
  (1) obtaining a moldboard being pervious to light and having a protruding-and-recessing figure and forming a masking layer by way of sputtering deposition of a masking material on said mold board;
  (2) after solidifying the masking layer, grinding a portion of the protruding-and-recessing figure making a remaining portion of the protruding-and-recessing figure pervious to light;
  (3) obtaining a substrate and depositing negative photoresist on said substrate;
  (4) covering said moldboard with said substrate that has said protruding-and-recessing figure for further processing Step and Flash from the said moldboard side;
  (5) after finishing said Step and Flash process, removing said moldboard from said substrate; and
  (6) with developer, washing unexposed portions of the thin film covered with said negative photoresist on said substrate to show the exposed portion whereby produces high aspect ratio pattern.

5. The method according to claim 4, wherein said exposed portion of said negative photoresist forms macromolecule polymerization or is cross-linked after flashing and said unexposed portion is washed by an alkaline developer to form pattern needed.

6. The method according to claim 5, wherein the reaction mechanism of said negative photoresist comprises:

Photoinitiator + UV light = 2 radicals

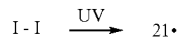

radical will transfer to the acrylic molecular it combines to and induce an active chain reaction unit

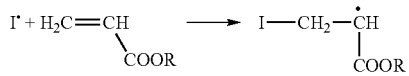

* * * * *